ELECTRICALLY CONDUCTIVE COMPOSITIONS
Original Filed Nov. 20, 1962
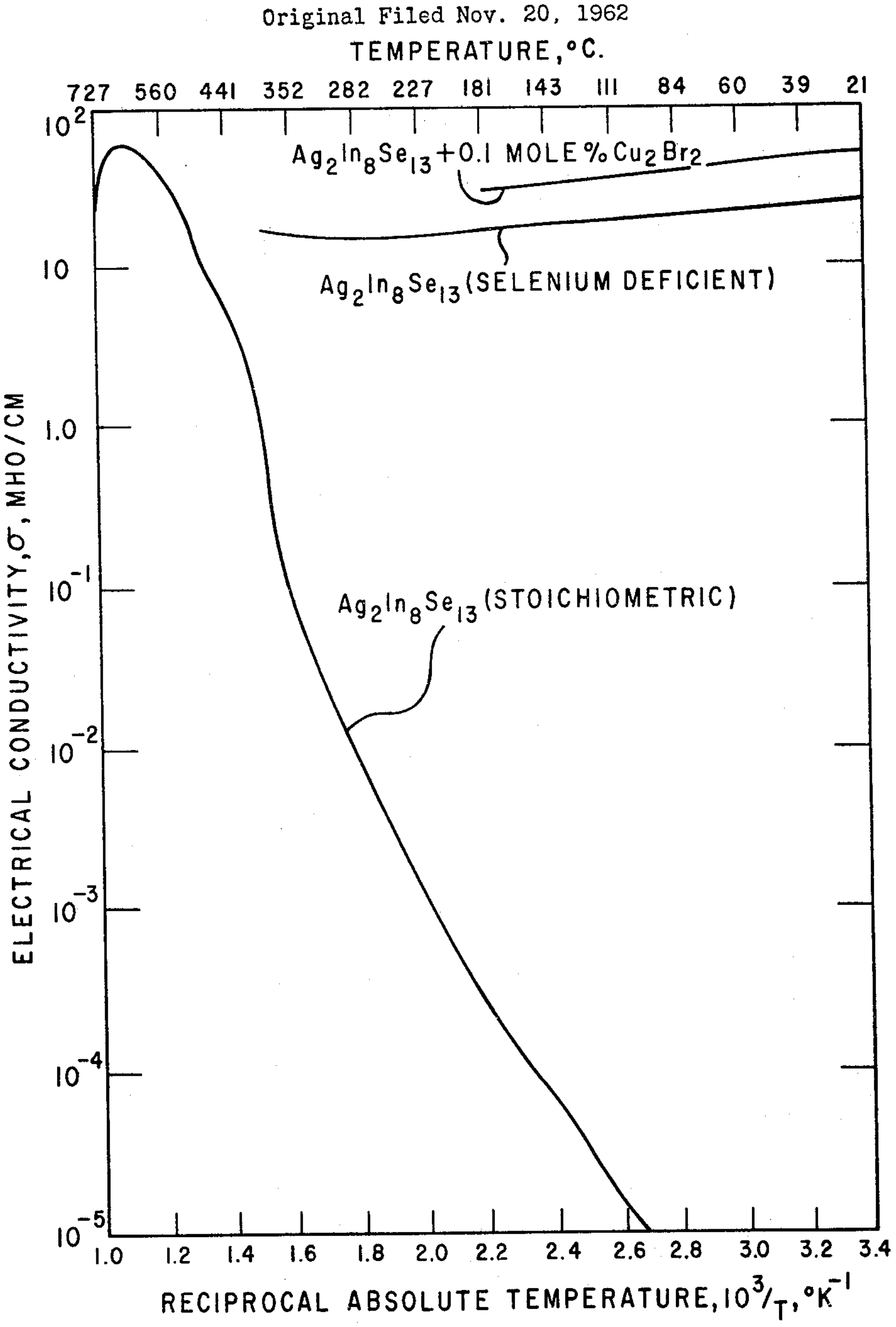
INVENTOR.
DANIEL F. O'KANE
BY Robert J. Crawford 3,505,245

ELECTRICALLY CONDUCTIVE COMPOSITIONS

Daniel F. O'Kane, Dobbs Ferry, N.Y., assignor, by mesne assignments, to Texas Instruments Incorporated, Dallas, Tex., a corporation of Delaware Original application Nov. 20, 1962, Ser. No. 238,913, now Patent No. 3,347,639, dated Oct. 17, 1967. Divided and this application Aug. 24, 1967, Ser. No. 688,631
Int. Cl. H01b *1/02*
U.S. Cl. 252—512 3 Claims

ABSTRACT OF THE DISCLOSURE

The present invention relates to semiconductor alloys or compositions whose major constituents comprise silver, indium and selenium, and in particular to electrical conductors comprised of said compositions.

This application is a division of Ser. No. 238,913, filed Nov. 20, 1962, now Patent No. 3,347,639.

It is an object of the present invention to provide electrical conductors whose major constituents are silver, indium and selenium.

Another object of the invention is to provide electrical resistance compositions primarily comprised of silver, indium and selenium.

Still another object is to provide compositions or alloys whose major constituents are silver, indium and selenium and whose electrical characteristics can be varied over a wide range.

Yet another object is to provide new semiconductor alloys or compositions whose major constituents are silver, indium and selenium.

A specific object of the invention is to provide electrically conductive alloys or compositions suitable as resistor materials and whose resistivity is constant over a wide range of temperatures.

Other objects, features and advantages will become apparent from the following detailed description when taken in connection with the appended claims and the attached drawing wherein the sole figure is a graphical representation of the electrical conductivity of the composition of the invention as a function of temperature.

The composition of the invention can best be described as a congruently melting compound comprised of the three major constituents silver, indium and selenium. A congruently melting composition or compound is one that has a single melting point. The compound is best described by the stoichiometric formula $Ag_2In_8Se_{13}$ and can be fabricated by any one of several methods.

It has been found that the composition is a semiconductor whose electrical properties can be adjusted over wide ranges of values. One of the better known electrical properties of a semiconductor is, of course, the existence of a negative temperature coefficient of resistance over at least some temperature interval. The composition of the invention strongly exhibits this property, but in addition, the temperature coefficient of resistance for a given temperature interval can be varied from a negative value to a positive value by slightly varying the constituents of the compositions from the true stoichiometric ratio expressed by the chemical formula $Ag_2In_8Se_{13}$, or alternatively, in some instances, by incorporating in the composition suitable donor or acceptor impurities. In this connection it is proper and simpler to speak of the composition as one whose major constituents are the same as, but whose proportions vary slightly from the true stoichiometric ratio of the chemical compound $Ag_2In_8Se_{13}$. Thus the invention provides a new semiconductor stoichiometric compound $Ag_2In_8Se_{13}$, and also provides a composition useful as a conductor whose electrical conductivity can be varied as desired, and whose major constituents are the same as, but whose proportions vary only slightly from the true stoichiometric ratio of the chemical compound $Ag_2In_8Se_{13}$.

One of the major features of the invention is the provision of a composition having as its major constituents silver, indium and selenium, the proportions of which vary only slightly from the true stoichiometric ratio of the chemical compound $Ag_2In_8Se_{13}$, so that the composition exhibits a virtually zero temperature coefficient of resistance over an extended temperature interval. This particular composition manifests its utility in one embodiment as a resistor, and as such, the resistance is non-varying over the above-noted temperature interval. It has been found that the zero temperature coefficient of resistance characteristic of this composition is the result of selenium atom deficiencies and/or the inclusion within the composition of suitable acceptor or donor atoms. It has also been found that the exetnt of selenium atom deficiency from the stoichiometric ratio of the chemical compound $Ag_2In_8Se_{13}$ will provide that composition with a very low temperature coefficient of resistance over an extended temperature interval is in the order of a few parts per million, as will be explained below.

To more completely describe the compositions and important properties thereof, reference is had to the sole figure which is a graph of the electrical conductivity of various samples of the material as a function of temperature. The electrical conductivity of the stoichiometric semiconductor compound $Ag_2In_8Se_{13}$ is shown to increase from about $10^{-6}$–$10^{-7}$ mhos/cm. at room temperature to a peak of about 50–60 mhos/cm. at a temperature between 600° C. and 700° C., the conductivity then decreasing as the temperature further increases. This conductivity characteristic is believed to result from extrinsic conduction over the lower temperature range, say up to 200–250° C., and intrinsic conduction above this range. The maximum conductivity of the sample occurs in the temperature range of about 575° C.–725° C., and this appears to result from a chemical phase change occurring in the sample.

The conductance versus temperature curve of two compositions each having the same major constituents (silver, indium and selenium) as the stoichiometric semiconductor compound but having a slight deficiency, say a few parts per million, of selenium atoms is also shown in the figure. In other words, the composition is the same chemical compound with the proportions of the constituent atoms approximating the stoichiometric ratio of $Ag_2In_8Se_{13}$. It has been found that this composition exhibits an approximately constant electrical conductivity over a wide temperature range. This phenomenon is believed to be explained in the following manner: for each selenium vacancy there remains in the composition or material one or two electrons available for conduction that were not present in the stoichiometric compound. The few parts per million available electrons for conduction resulting from the selenium deficiency is adequate to impart a relatively high electrical conductivity to the composition at room temperature, and this effect obscures the effect of any intrinsic conduction of the composition. Moreover, as the temperature is increased from room temperature, the mobility of the carriers is affected little, if any, over this temperature interval. As a result, the conductivity of the composition remains substantially constant. At the higher end of the temperature scale, more electrons are excited to the conduction band with a resulting increase in conductivity until the temperature is reached where the moility decreases more rapidly than the number of available current carriers increases. Thus a decrease in conductivity is observed. The two curves are indicative of substantially the same composition but with slightly different selenium deficiences, the one having the higher conductivity having the greater selenium deficiency.

Providing a selenium deficiency is only one way of altering the electrical characteristics of the stoichiometric compound $Ag_2In_8Se_{13}$. The foregoing method is more aptly described as altering the characteristics by a deficiency of one of the constituent elements of the compound. In this example the resulting composition is n-type conductivity in character since the removal of selenium atoms from the lattice leaves remaining net electrons, some or all of which may be electrically active.

The conductivity of the stoichiometric compound can also be altered by the introduction of a suitable impurity as a doping agent to impart extrinsic conduction to the composition. Since extrinsic conduction of a semiconductor is well known in the art, a description of the phenomenon involved will not be undertaken at this time. Suffice it to say that a substantially constant electrical conductivity characteristic can be imparted to the compound over an extensive temperature interval as shown in the figure. One such example is shown in the figure where 0.1 mole percent of $Cu_2Br_2$ is added to the stoichiometric compound $Ag_2In_8Se_{13}$ during the preparation thereof. A similar effect is observed when the compound is doped with other impurities such as copper atoms.

Turning to the fabrication of the specific compositions of the invention, the stoichiometric semiconductor compound $Ag_2In_8Se_{13}$ can be prepared by any number of suitable methods. For example, the compound can be prepared by mixing together stoichiometric amounts of the three elements silver, indium and selenium and heating them together to a temperature in excess of the melting point of the highest temperature melting element. This will be in excess of 960° C., since this temperature is the melting point of silver. The elements are well mixed at this temperature, and the temperature is subsequently reduced.

It has also been found that melting together the two compounds $Ag_2Se$ and $In_2Se_3$ in a quartz ampule under a suitable inert atmosphere such as argon or under a vacuum in the ratio of 20 mole percent $Ag_2Se$ and 80 mole percent $In_2Se_3$, results in the congruently melting compound $Ag_2In_8Se_{13}$. The constituents are completely mixed at a temperature sufficiently high to ensure complete melting of each of the constituents, say at a temperature in excess of 900° C., which is in excess of the melting point of either of the two starting compounds. Subsequently, the temperature is slowly lowered until the compound freezes congruently at a temperature of about 815–3° C. In order to ensure homogeneity and to remove any residuary impurities in the stoichiometric compound $Ag_2In_8Se_{13}$ made by either of the above two methods, the material can be zone refined, this process being well known to those skilled in the art. The material is considered pure when it exhibits electrical properties of an intrinsic nature as shown by the stoichiometric curve in the figure. It should be noted in connection with the methods abovedescribed that any other suitable methods can be used to prepare and purify the compound.

In connection with preparation of the compound, selenium is apt to be lost in the process unless the compound is prepared under a selenium atmosphere. If the preparation is carried out in a closed ampule, for example, the selenium lost will establish an ambient equilibrium pressure and the selenium loss will eventually be arrested. Then, after the mixing of the two constituents $Ag_2In_8Se_{13}$ is complete and the composition has been solidified, a sufficient number of zone refining passes can be carried out to drive from the composition any excess indium and silver resulting from the initial loss of selenium. Thus the preparation of a substantially intrinsic sample of the compound $Ag_2In_8Se_{13}$ can be effected.

Referring now more particularly to the electrical properties of the semiconductor compound, it has been found that subsequent annealing the stoichiometric compound $Ag_2In_8Se_{13}$ caused the room temperature electrical conductivity of the sample to increase by several orders of magnitude, provided the sample is heated in excess of about 525° C. This has been found to result from the loss of selenium atoms accompanying the heating cycle. Moreover, it has been found that the electrical conductivity of the now altered sample can be returned to its original low room temperature value by reheating the sample in the presence of a sufficient selenium vapor to cause selenium atoms to go back into the lattice of the crystals of the sample, thus re-establishing the true stoichiometric ratio. For example an original stoichiometric sample having a room temperature electrical conductivity in the order of about $10^{-7}$ mho/cm. was heated to a temperature in excess of 530° C. in an argon atmosphere, thus changing the room temperature electrical conductivity to about .16 mho/cm. Then the sample was reheated to about 530° C. in the presence of selenium vapor, and the room temperature electrical conductivity was returned to a value in the order of about $10^{-6}$ mho/cm.

It is interesting to note that the loss of selenium from the stoichiometric compound $Ag_2In_8Se_{13}$ neither changes the composition to a different compound nor alters the chemical phase of the original compound, provided the compound does not undergo a sustained loss of selenium at temperatures in excess of 700° C. In particular, the curves of the graph illustrating the selenium deficient compositions are the same chemical compounds as the original but are slight departures from the true stoichiometric ratio of the compound $Ag_2In_8Se_{13}$. As examples, the deficiencies from the stoichiometric ratio have been found to range from 50–500 parts per million selenium atoms. It is to be understood, however, that greater or less deficiencies are possible, whereas the greater the selenium deficiency, the greater the room temperature conductivity of the composition.

Although the invention has been described with reference to specific examples, it should be understood that certain modifications and substitutions will become apparent to those skilled in the art, without departing from the scope of the invention as defined in the appended claims.

What is claimed is:

1. A composition comprising the compound $Ag_2In_8Se_{13}$ containing an active impurity effective to modify the electrical conductivity of said compound.

2. The composition as defined in claim 1 wherein said active impurity is copper.

3. The composition as defined in claim 1 wherein said active impurity is $Cu_2Br_2$.

References Cited

UNITED STATES PATENTS

| | | | |
|---|---|---|---|
| 2,944,975 | 7/1960 | Folberth | 23—204 |
| 3,008,797 | 11/1961 | Bither | 23—14 |
| 3,074,871 | 1/1963 | Lustman et al. | 75—173 |
| 3,238,134 | 3/1966 | Fleischmann | 252—52.3 |
| 3,256,697 | 6/1966 | Henderson | 252—623 |
| 3,388,053 | 6/1968 | Sinclair et al. | 252—518 |

DOUGLAS J. DRUMMOND, Primary Examiner

U.S. Cl. X.R.

252—518